United States Patent
Fang (10) Patent No.: US 7,635,610 B2
(45) Date of Patent: Dec. 22, 2009

(54) MULTI-CHIP STACK PACKAGE AND FABRICATING METHOD THEREOF

(75) Inventor: Jen-Kuang Fang, Pingtung Hsien (TW)

(73) Assignee: Adavnaced Semiconductor Engineering Inc., Kaohsiung (TW)

( * ) Notice: Subject to any disclaimer, the term of this patent is extended or adjusted under 35 U.S.C. 154(b) by 209 days.

(21) Appl. No.: 11/689,507

(22) Filed: Mar. 21, 2007

(65) Prior Publication Data
US 2007/0166879 A1 Jul. 19, 2007

Related U.S. Application Data

(62) Division of application No. 10/248,296, filed on Jan. 7, 2003, now abandoned.

(30) Foreign Application Priority Data
Jan. 7, 2002 (TW) .............................. 91100096 A (51) Int. Cl.
*H01L 21/00* (2006.01)
(52) U.S. Cl. ................ 438/106; 438/108; 256/E21.503
(58) Field of Classification Search ................ 438/106, 438/107, 108, 109, 127, 614; 257/E21.503
See application file for complete search history.

(56) References Cited

U.S. PATENT DOCUMENTS

| 5,726,502 A | * | 3/1998 | Beddingfield | ................ 257/797 |
| 6,127,724 A | * | 10/2000 | DiStefano | ................... 257/675 |
| 6,157,080 A | * | 12/2000 | Tamaki et al. | ................ 257/738 |

FOREIGN PATENT DOCUMENTS

JP 05-315540 * 11/1993

* cited by examiner

*Primary Examiner*—Michael Trinh
(74) *Attorney, Agent, or Firm*—Jianq Chyun IP Office (57) ABSTRACT

A multi-chip stack package includes a substrate, a first chip, a second chip, a plurality of bumps, a plurality of junction interface bumps, a plurality of conductive wires, a filler material and an encapsulating material. The substrate has a plurality of first contacts and a plurality of second contacts thereon. The first chip is bonded to the substrate surface by the bumps positioned between the active surface of the first chip and the first contacts. The second chip is bonded to the first chip by the junction interface bumps positioned between the back surface of the first chip and the back surface of the second chip. The conductive wires electrically connect the active surface of the second chip and the second contacts. The filler material encloses the bumps and the junction interface bumps. The encapsulating material encloses the first chip, the second chip and the conductive wires.

9 Claims, 8 Drawing Sheets

MULTI-CHIP STACK PACKAGE AND FABRICATING METHOD THEREOF

CROSS-REFERENCE TO RELATED APPLICATION

This application is a divisional application of a prior application Ser. No. 10/248,296, filed Jan. 7, 2003, which claims the priority benefit of Taiwan application serial no. 91100096, filed Jan. 7, 2002. All disclosures are incorporated herewith by reference.

BACKGROUND OF THE INVENTION

1. Field of Invention

The present invention relates to a multi-chip stack package. More particularly, the present invention relates to a multi-chip stack package and a fabricating method thereof, wherein the quality of a multi-chip stack package is improved.

2. Description of Related Art

As electronic technology continues to advance, more personalized, multi-functional high-tech electronic products are being introduced into the market. The newer electronic products are characteristically smaller, lighter and slimmer. As a result, the products occupy less space and are more portable. In the semiconductor manufacturing, many types of packages now incorporate a multi-chip concept so that volume occupation of an integrated circuit is reduced and electrical performance is improved. In a multi-chip stack package, few chips are stacked over each other and enclosed inside the package so that horizontal sectional area of the package is greatly reduced.

Figure 1:
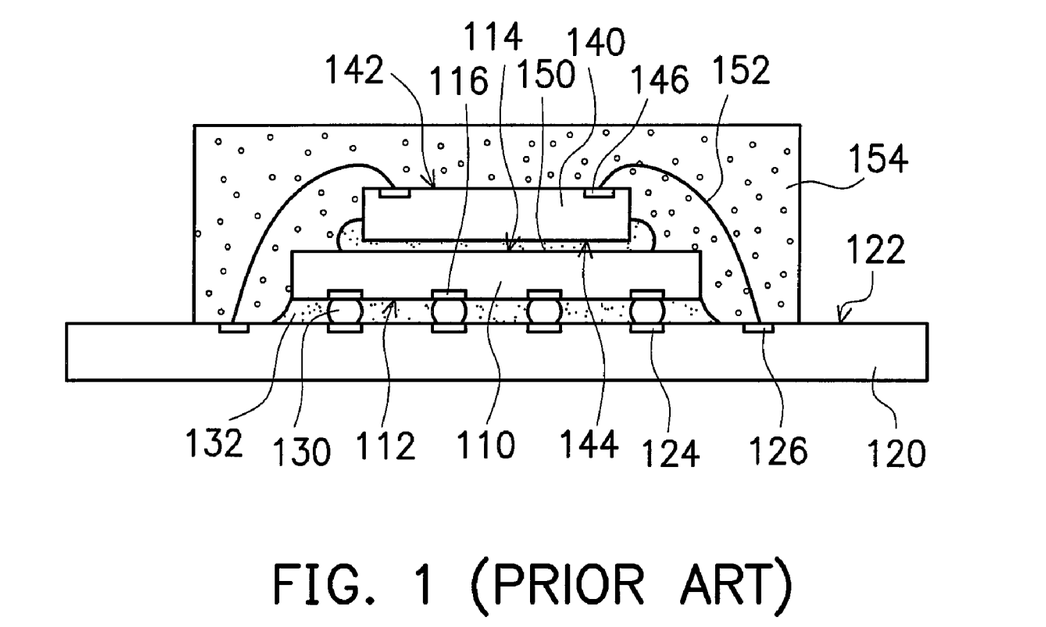
FIG. 1 is a cross-sectional view of a conventional multi-chip stack package.

FIG. 1 is a cross-sectional view of a conventional multi-chip stack package. To fabricate a multi-chip stack package, a first chip 110 having a first active surface 112 and a first chip back surface 114 is provided. The first chip 110 further includes a plurality of first bonding pads 116 positioned over the active surface 112. A substrate 120 having a substrate surface 122 is also provided. The substrate 120 has a plurality of first contacts 124 and a plurality of second contacts 126 on the substrate surface 122. The first chip 110 and the substrate 120 are joined together using a conventional flip chip method. First, a plurality of bumps 130 are formed over the first bonding pads 116 of the first chip 110. Thereafter, the first chip 110 is positioned over the substrate 120 such that each bump 130 is aligned with a corresponding first contact 124 on the substrate surface 122. A reflow process is conducted so that the bumps 130 and the first contacts 124 are bonded together. Afterwards, filler material 132 is injected into the space between the chip 110 and the substrate 120 so that the filler material 132 encloses the bumps 130. A second chip 140 having a second active surface 142 and corresponding second chip back surface 144 is provided. The second chip 140 further includes a plurality of second bonding pads 146 positioned on the second active surface 142. Through adhesive glue 150, the second chip back surface 144 of the second chip 140 is attached to the first chip back surface 114. A wire-bonding operation is conducted to form a plurality of conductive wires 152 with one end bonded to the second bonding pads 146 of the second chip 140 and the other end bonded to the second contacts 126 on the substrate 120. Finally, the first chip 110, the second chip 140 and the conductive wires 152 are encapsulated by injecting packaging glue 150 in a molding process.

In the aforementioned fabrication process, the adhesive glue 150 is spread over the first chip back surface 114 before attaching the second chip 140 onto the first chip back surface 114 in the process of joining the first chip 110 and the second chip 140. However, when excessive attaching pressure is applied to the second chip 140, some adhesive material 150 may bleed out. In other words, some of the adhesive glue 150 may be forced out from the attachment region of the second chip 140. In some cases, the adhesive glue 150 may 'climb' to the second active surface 142, and hence affecting the wire-bonding operation. If the adhesive glue 150 creeps into the second bonding pad 146 surface, the conductive wire 152 is no longer able to bond with the second bonding pad 146. In addition, the wire-bonding head (not shown) of the wire-bonding machine (not shown) may also drag up some adhesive material. Ultimately, the quality of electrical connections between the first chip 110 and the second chip 140 is likely to be affected.

SUMMARY OF THE INVENTION

Accordingly, the present invention is to provide a multi-chip stack package and a fabricating method thereof that can improve bonding quality of the multi-chip stack.

In accordance to the invention as embodied and broadly described herein, a multi-chip stack package is provided. The multi-chip stack package includes at least a substrate, a first chip, a second chip, a plurality of bumps, a plurality of junction interface bumps, a plurality of conductive wires, some first filler material, some second filler material and some packaging material. The substrate has a substrate surface with a plurality of first contacts and a plurality of second contacts thereon. The first chip has a first active surface and a first chip back surface. The first chip also has a plurality of first bonding pads on the first active surface. The first chip is attached to the empty area on the substrate surface such that the first active surface faces the substrate surface. The second chip has a second active surface and a corresponding second chip back surface. The second chip has a plurality of second bonding pads on the second active surface. The second chip is attached to the empty area on the first chip back surface such that the second chip back surface faces the first chip back surface. The bumps are positioned between the first bonding pads and the first contacts. The junction interface bumps are positioned between first chip back surface and the second chip back surface. One end of each conductive wire is bonded to one of the second bonding pads while the other end of the conductive wire is bonded to the second contact. The first filler material encloses the bumps. The second filler material encloses the junction interface bumps. The packaging material encloses the first chip, the second chip and the conductive wires.

According to the embodiment of this invention, an under-bump-metallurgy layer also may form on the first chip back surface and the second chip back surface. The under-bump-metallurgy layer includes a barrier layer and a seed layer. The barrier layer is fabricated using a material such as titanium, tungsten-titanium or chromium and the seed layer is fabricated using a material such as copper. In addition, the junction interface bumps are fabricated using a material such as lead-tin alloy.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or similar parts.

Figure 2:
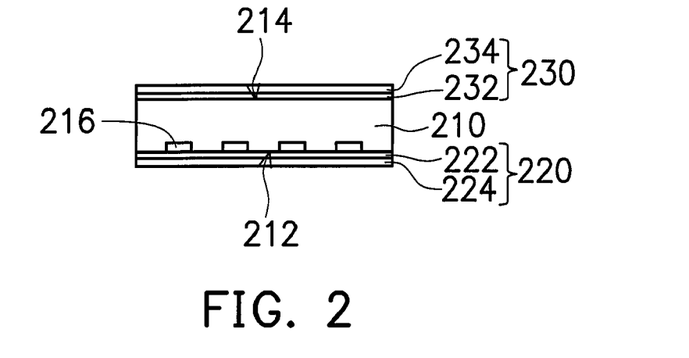
FIGS. 2 to 11 are schematic, cross-sectional views showing the progression of steps for fabricating a multi-chip stack package according to a first preferred embodiment of this invention.

FIGS. 2 to 11 are schematic cross-sectional views showing the progression of steps for fabricating a multi-chip stack package according to a first preferred embodiment of this invention. As shown in FIG. 2, a first chip 210 having a first active surface 212 and a first chip back surface 214 is provided. The first chip 210 further includes a plurality of first bonding pads 216 positioned on the first active surface 212 of the first chip 210. Thereafter, a process is carried out to form an under-bump-metallurgy layer. To form the under-bump-metallurgy layer, a sputtering process is conducted to form a first barrier layer 222 and a second barrier layer 232 over the first active surface 212 and the first chip back surface 214 of the first chip 210 respectively. The first barrier layer 222 and the second barrier layer 232 are fabricated using a material such as titanium, tungsten titanium or chromium. Thereafter, an electroplating is carried out to form a first seed layer 224 and a second seed layer 234 over the first barrier layer 222 and the second barrier layer 232 respectively. The first seed layer and the second seed layer are fabricated using a metallic material such as copper. Hence, a first under-bump-metallurgy layer 220 comprising of the first barrier layer 222 and the first seed layer 224 and a second under-bump-metallurgy layer 220 comprising of the second barrier layer 232 and the second seed layer 234 are formed.

Figure 3:
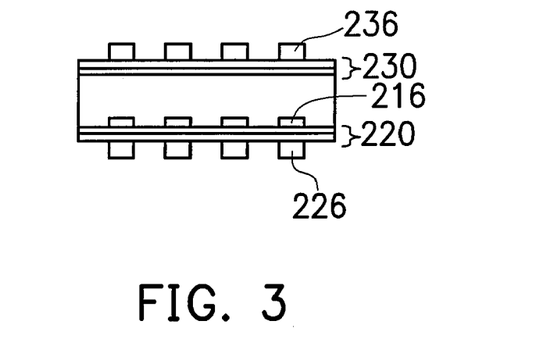

As shown in FIG. 3, a process for fabricating bumps is carried out. A screen printing or a photolithographic/electroplating method is used to form a plurality of first bumps 226 over the first under-bump-metallurgy layer 220 and a plurality of second bumps 236 over the second under-bump-metallurgy layer 230. The first bumps 226 must be positioned to correspond with the first bonding pads 216. The first bumps 226 and the second bumps 236 are fabricated using a lead-tin alloy having a high lead content such as a tin-lead content of 5/95.

Figure 4:
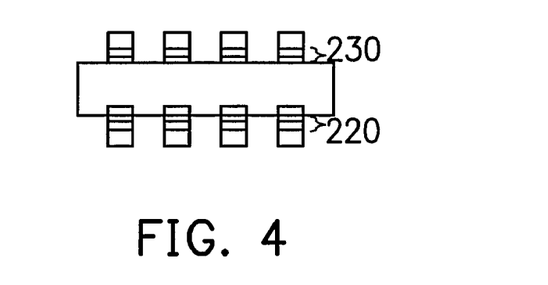

As shown in FIGS. 3 and 4, an etching operation is carried out using an etchant (not shown) that can remove the exposed first under-bump-metallurgy layer 220 and the second under-bump-metallurgy layer 230.

Figure 5:
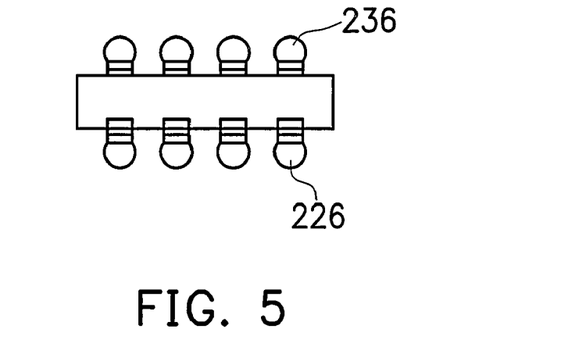

As shown in FIG. 5, a reflow operation is carried out so that the first bumps 226 and the second bumps 236 are transformed into mass of lumps having a spherical profile.

Figure 6:
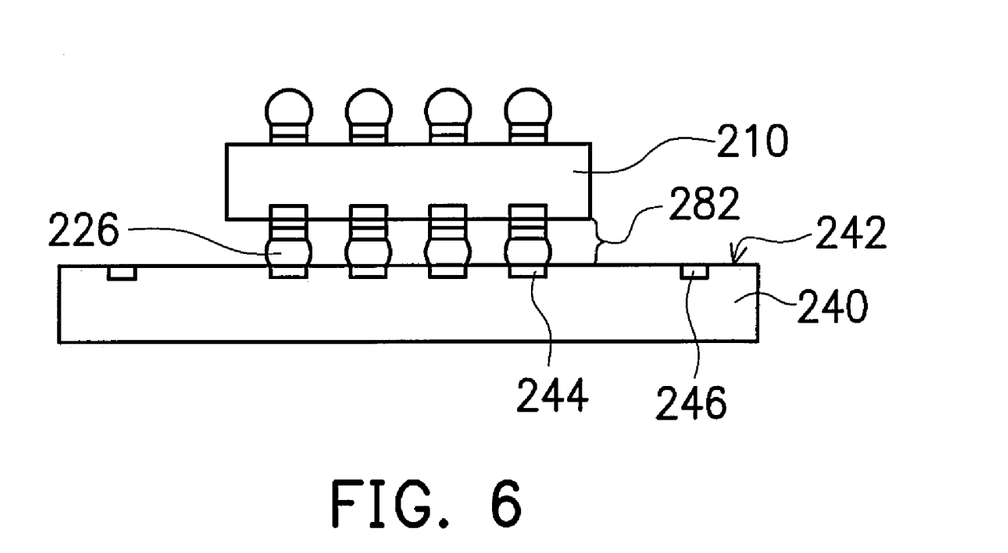

As shown in FIG. 6, a substrate 240 having a first substrate surface 242 is provided. The substrate 240 also has a plurality of first contacts 244 and a plurality of second contacts 246 positioned on the substrate surface 242. The second contacts 246 are located in a band that surrounds the first contacts 244. Next, a flip chip attachment process is carried out. The first bumps 226 are aligned with the first contacts 244 and then a reflow process is conducted so that the first bumps 226 are bonded with corresponding first contacts 244. Hence, the first chip 210 is firmly attached to the substrate 240 and a gap 282 is created between the first chip 210 and the substrate 240 by the first bumps 226.

Figure 7:
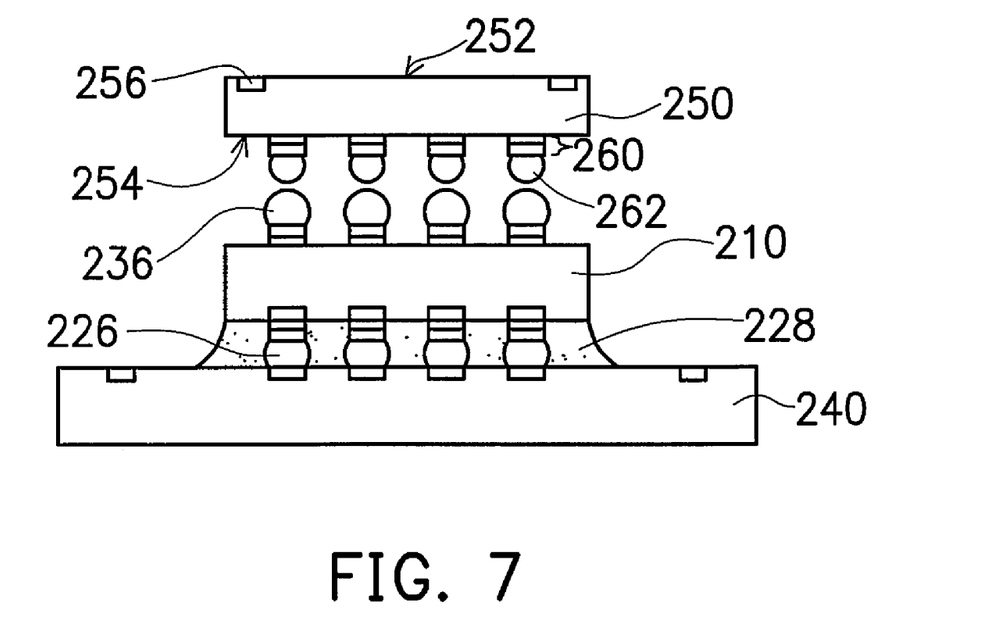

As shown in FIG. 7, a first filler material 228 is injected into the space between the first chip 210 and the substrate 240. The first filler material 228 encloses the first bumps 226.

Figure 8:
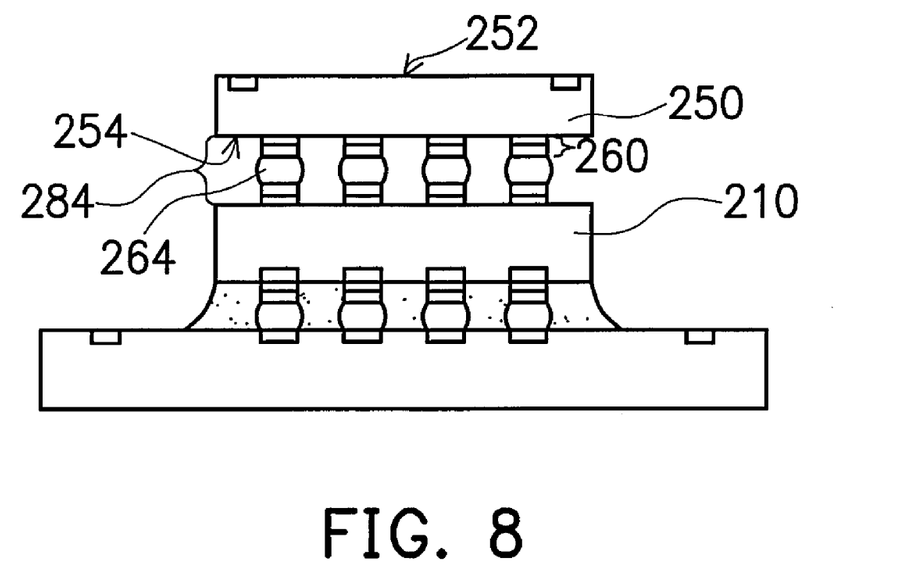

As shown in FIGS. 7 and 8, a second chip 250 having a second active surface 252 and a corresponding second chip back surface 254 is provided. The second chip 250 further includes a plurality of second bonding pads 256 positioned around the peripheral region over the second active surface 252. Before carrying out a chip bonding process, a third under-bump-metallurgy layer 260 and a plurality of third bumps 262 are formed on the second chip back surface 254. The third under-bump-metallurgy layer 260 and the third bumps 262 are formed in a similar way as the second under-bump-metallurgy layer 230 and the second bumps 236 with one major difference. The third bumps are fabricated using a lead-tin alloy having a low lead content such as a lead-tin alloy with a lead-tin ratio of 37/63. In the chip bonding process, the third bumps 262 and the second bumps 236 are properly aligned and then a reflow operation is carried out so that the third bumps 262 and their corresponding second bumps 236 are bonded together to form a plurality of junction interface bumps 264. Hence, the second chip 250 is firmly attached to the first chip 210, and a gap 284 is created between the first chip 210 and the second chip 250 by the junction interface bumps 264.

Figure 9:
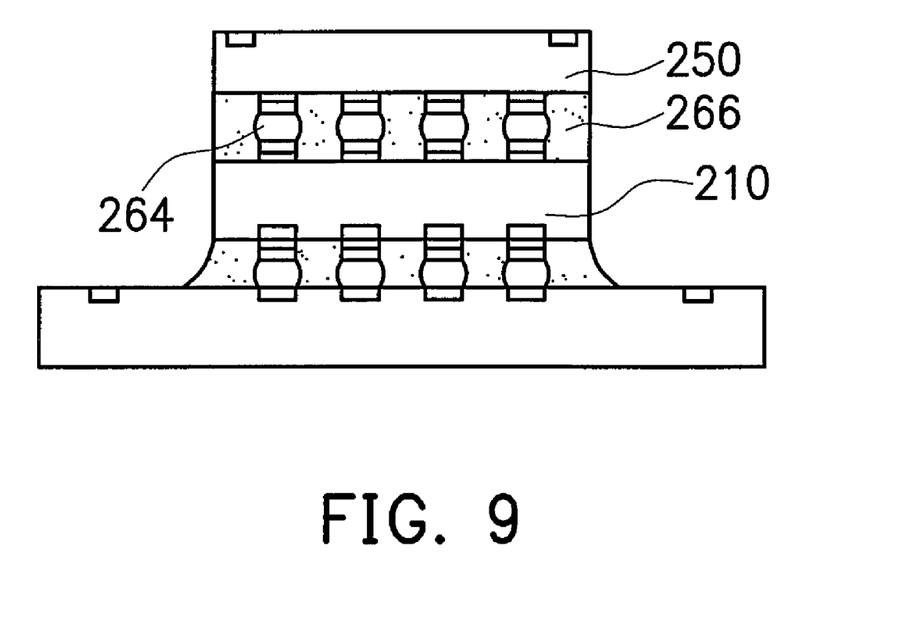

As shown in FIG. 9, a second filler material 266 is injected into the space between the first chip 210 and the second chip 250. The second filler material 266 encloses the interface junction bumps 264.

Figure 10:
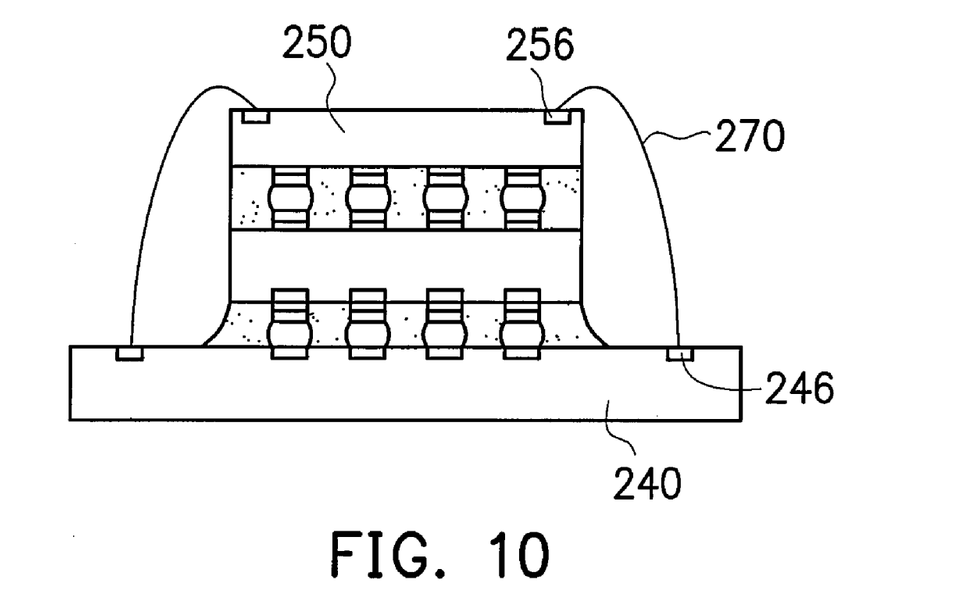

As shown in FIG. 10, a wire-bonding operation is carried out to form a plurality of bonding wires 270. One end of each wire 270 bonded to one of the second bonding pads on the second chip 250 and the other end bonded to one of the second contacts 246 on the substrate 240.

Figure 11:
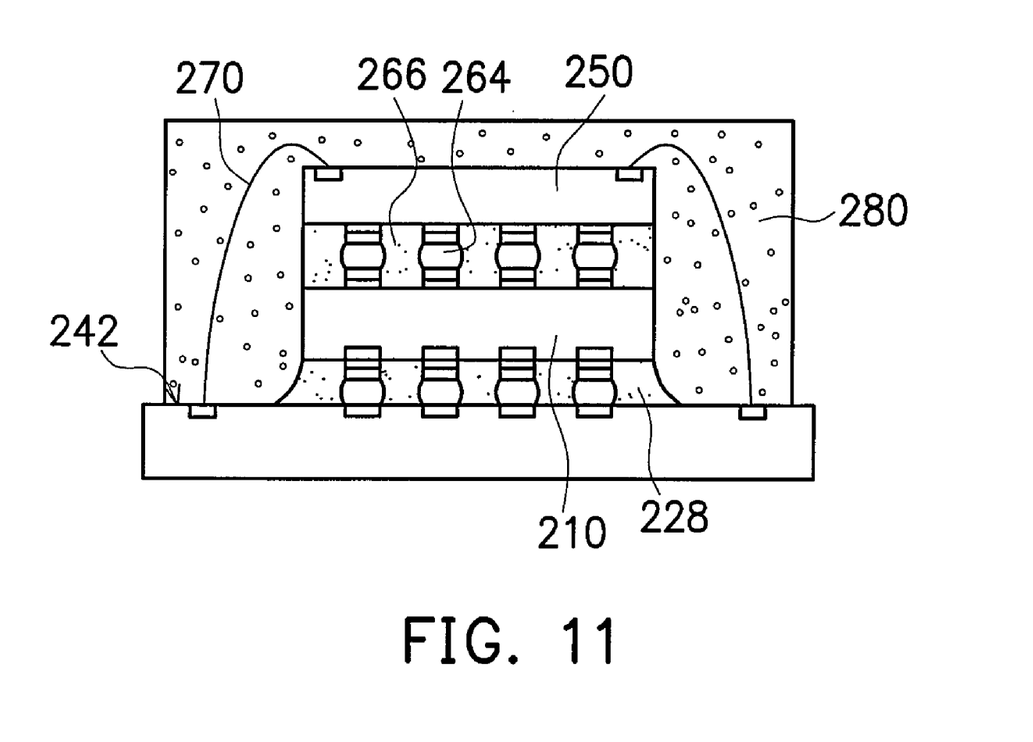

As shown in FIG. 11, a packaging process is carried out by injecting a packaging material 280 to enclose the first chip 210, the second chip 250, the conductive wires 270, the first filler material 228, the second filler material 266 and the substrate surface 242. Thus, fabrication of the multi-chip stack package 200 is complete.

In the aforementioned fabrication process, the junction interface bumps 264 creates a space between the first chip 210 and the second chip 250. Filling the space with the second filler material 266 prevents any filler material from squeezing out to form a patch of bled plastic material and improves the quality of junction between the first chip 210 and the second chip 250. Furthermore, since the junction interface bumps 264 are fabricated using lead-tin alloy, the junction interface bumps 264 provide better electrical properties than the conventional thermal conductive glue.

Figure 12:
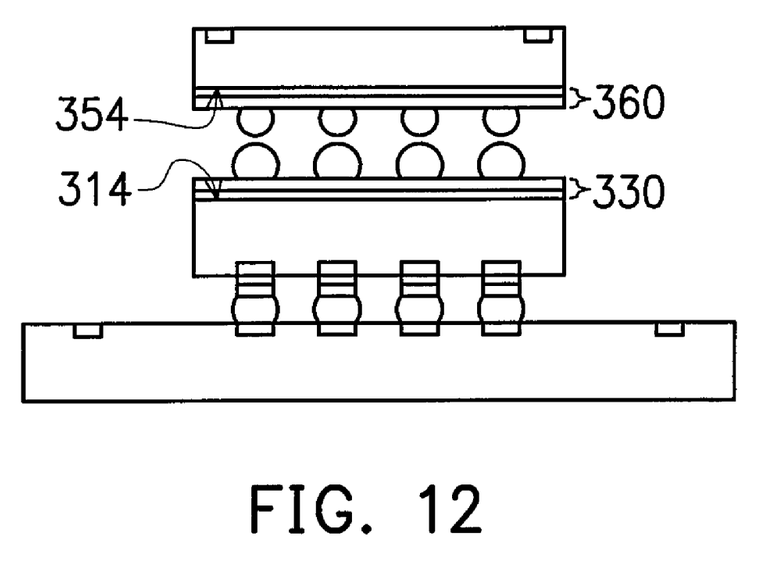
FIG. 12 is a schematic, cross-sectional view showing a step in the fabrication of a multi-chip stack package according to a second preferred embodiment of this invention.

In addition, an etching step is conducted in the aforementioned fabrication process to remove the exposed second under-bump-metallurgy layer and the third under-bump-metallurgy layer. However, the step of etching the second under-bump-metallurgy layer or the third under-bump-metallurgy layer may be deleted in a second preferred embodiment of this invention. FIG. 12 is a schematic cross-sectional view showing a step in the fabrication of a multi-chip stack package according to a second preferred embodiment of this invention. Without conducting an etching operation, the second under-bump-metallurgy layer 330 and the third under-bump-metallurgy layer 360 cover the entire surface of the first chip back surface 314 and the second chip back surface 354 respectively.

Figure 13:
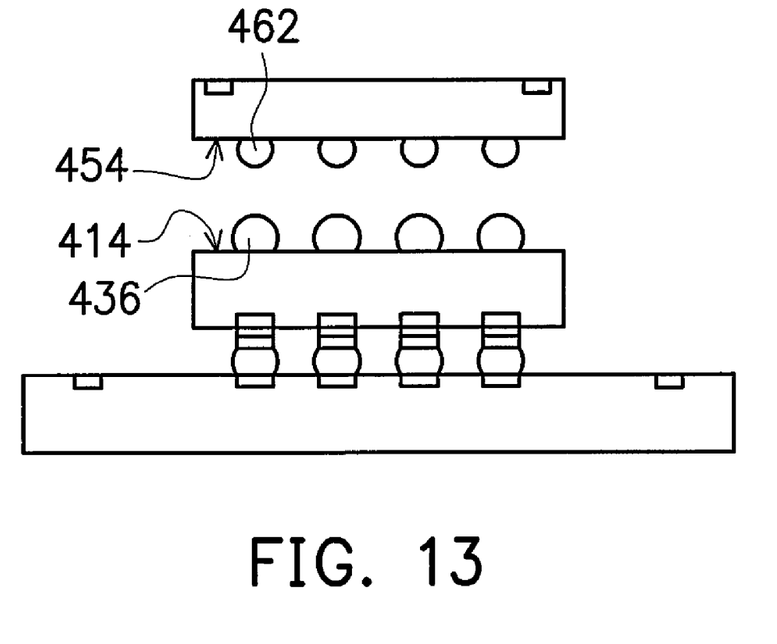
FIG. 13 is a schematic, cross-sectional view showing a step in the fabrication of a multi-chip stack package according to a third preferred embodiment of this invention.

In the aforementioned fabrication process, an under-bump-metallurgy layer is formed on the back surface of both the first chip and the second chip. However, the package still functions even if the first chip back surface has no second under-bump-metallurgy layer and the second chip back surface has no third under-bump-metallurgy layer. In the third embodiment of this invention, no under-bump-metallurgy layer is formed on the first chip back surface and the second chip back surface. FIG. 13 is a schematic cross-sectional view showing a step in the fabrication of a multi-chip stack package according to a third preferred embodiment of this invention. Without an under-bump-metallurgy layer, the second bumps 436 and the third bumps 462 are directly formed on the first chip back surface 414 and the second chip back surface 454 respectively.

Figure 14:
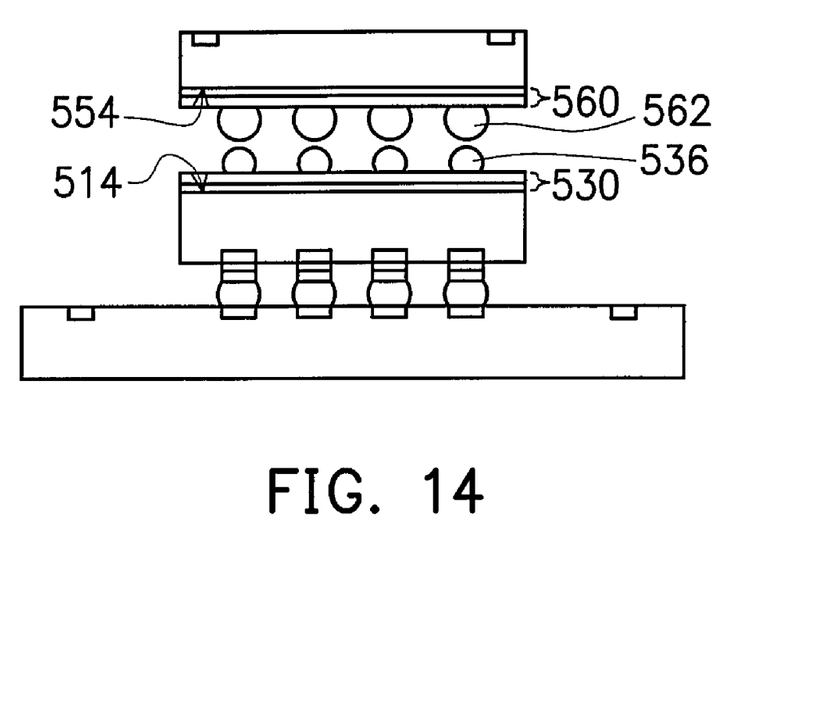
FIG. 14 is a schematic, cross-sectional view showing a step in the fabrication of a multi-chip stack package according to a fourth preferred embodiment of this invention.

In the aforementioned fabrication process, second bumps with a relatively high lead content are formed over the second under-bump-metallurgy layer on the first chip back surface and third bumps with a relatively low lead content are formed over the third under-bump-metallurgy layer on the second chip back surface. However, an alternative arrangement as shown in FIG. 14 may be used. FIG. 14 is a schematic cross-sectional view showing a step in the fabrication of a multi-chip stack package according to a fourth preferred embodiment of this invention. In FIG. 14, the second bumps 536 over the second under-bump-metallurgy layer 530 on the first chip back surface 514 have a relatively low lead content and the third bumps 562 over the third under-bump-metallurgy layer 560 on the second chip back surface 554 have a relatively high lead content. With this arrangement, the second bumps 536 and the third bumps 562 may still join together to form a plurality of junction interface bumps.

Figure 15:
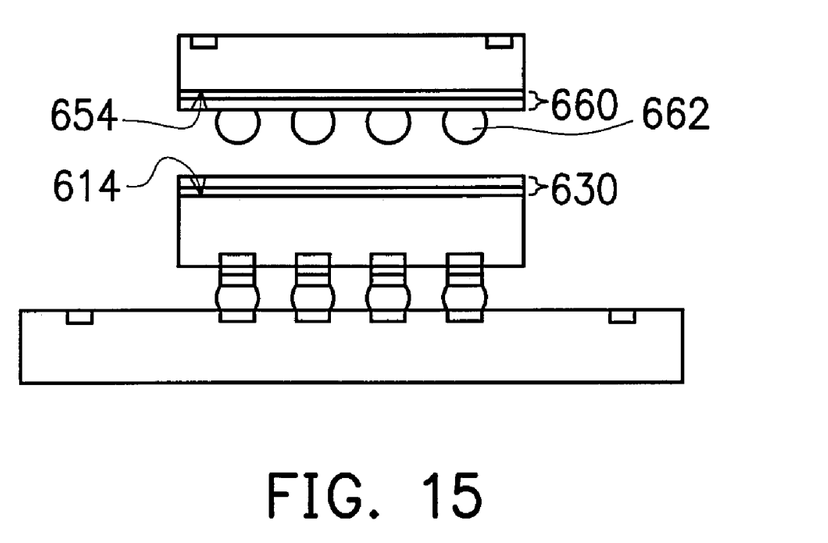
FIG. 15 is a schematic, cross-sectional view showing a step in the fabrication of a multi-chip stack package according to a fifth preferred embodiment of this invention.

In the aforementioned fabrication process, bumps with relatively high lead content and bumps with relatively low lead content are formed on the back surface of the two chips before joining the chips together. However, it is equally feasible to form a plurality of bumps over the under-bump-metallurgy layer on the back surface of just one chip before joining the first and the second chips together as shown in FIG. 15. FIG. 15 is a schematic cross-sectional view showing a step in the fabrication of a multi-chip stack package according to a fifth preferred embodiment of this invention. In FIG. 15, a plurality of bumps 662 is formed over the third under-bump-metallurgy layer 660 on the second chip back surface 654 only. Through a reflow process, the bumps 662 bond with the second under-bump-metallurgy layer 630 on the first chip back surface 614 to form junction interface bumps. One end of the interface junction bump joins up with the third under-bump-metallurgy layer 660 while the other end joins up with the second under-bump-metallurgy layer 630. The bumps 662 may be fabricated using a lead-tin alloy having a low lead content.

Figure 16:
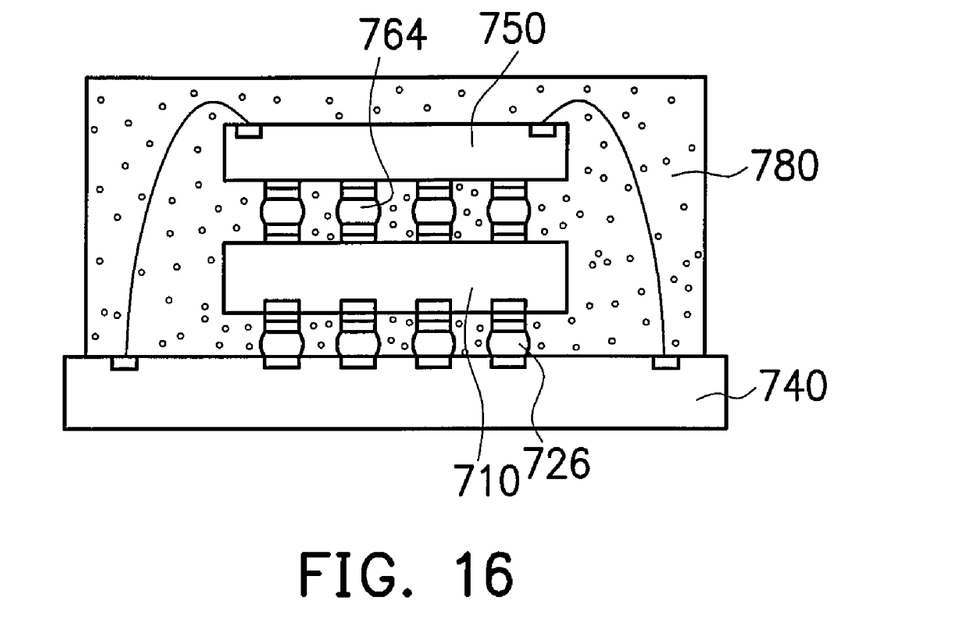
FIG. 16 is a schematic, cross-sectional view showing a step in the fabrication of a multi-chip stack package according to a sixth preferred embodiment of this invention.

In the aforementioned fabrication process, a first filler material is injected into the space between the first chip and the substrate after joining the first chip and the substrate together. Similarly, a second filler material is injected into the space between the second chip and the first chip after joining the second chip and the first chip together. Finally, packaging material is used to enclose the chips. However, an alternative processing arrangement as shown in FIG. 16 may be implemented. FIG. 16 is a schematic cross-sectional view showing a step in the fabrication of a multi-chip stack package according to a sixth preferred embodiment of this invention. In FIG. 16, the first bumps 726 and the junction interface bumps 764 are enclosed when packaging material 780 flows into the space between the first chip 710 and the substrate 740 and the space between the second chip 750 and the first chip 710 in the final packaging process.

Figure 17:
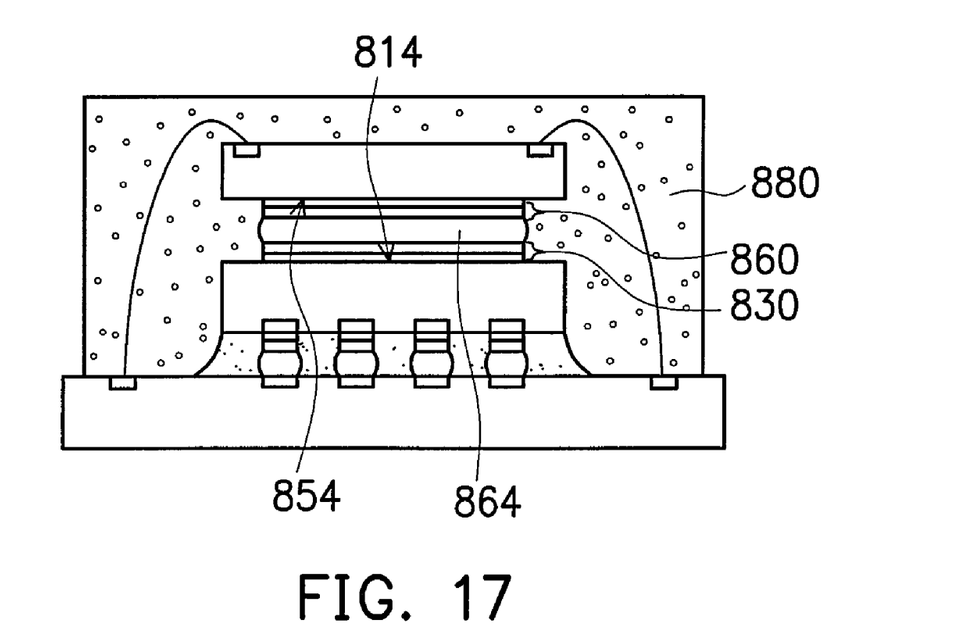
FIG. 17 is a schematic, cross-sectional view showing a step in the fabrication of a multi-chip stack package according to a seventh preferred embodiment of this invention.

In the aforementioned fabrication process, a plurality of junction interface bumps is used to bond the first chip and the second chip together. However, the fabrication process in this invention need not be restricted as such. FIG. 17 is a schematic cross-sectional view showing a step in the fabrication of a multi-chip stack package according to a seventh preferred embodiment of this invention. In FIG. 17, only one junction interface bump 864 with one end joining to the second under-bump-metallurgy layer 830 on the first chip back surface 814 and the other end joining to the third under-bump-metallurgy layer 860 on the second chip back surface 854 is used. In addition, the packaging material 880 directly encloses the junction interface bump 864.

Anyone familiar with fabrication technologies may notice that the multi-chip stack package according to this invention is not limited to the structural layout as shown in the figures. In fact, each embodiment may be applied singly or in combination with others to form a complete package.

One major aspect of this invention is the positioning of at least one bump to join up the back surface of two chips. In general, the two chips have very similar expansion coefficiency. Hence, the bump will not detach from the chip surfaces after repeated cyclic expansion and contraction even if the bumps joining the two chips are not enclosed by a filler material.

In summary, major advantages of this invention include:

1. The multi-chip stack package has a plurality of junction interface bumps that creates a space between the first chip and the second chip. The space is subsequently filled with a second filler material. In this way, out-bleeding of second filler material from a space is prevented and hence junction quality between the first chip and the second chip is improved.

2. Since the junction interface bumps are fabricated using a lead-tin alloy, electrical properties of the interface junction bumps are much better than the chips joined by conventional thermal conductive plastics. Hence, electrical performance between the first and the second chip is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a multi-chip stack package, the method comprising:
   providing a substrate having a plurality of first contacts and a plurality of second contacts formed on a substrate surface;
   providing a first chip having a first active surface and a corresponding first back surface;
   providing a second chip having a second active surface and a corresponding second back surface;
   forming a plurality of first bumps on the first active surface and a plurality of second bumps on the first back surface;
   forming a first under-bump-metallurgy (UBM) layer between the second bumps and the first back surface, wherein the first UBM layer is formed covering substantially the entire first back surface;
   forming a plurality of third bumps on the second back surface;
   bonding the first chip to the substrate by bonding the first bumps to the first contacts; and
   bonding the second chip to the first chip by bonding the second bumps to the third bumps.

2. The method of claim 1 further comprising forming a second UBM layer between the third bumps and the second back surface.

3. The method of claim 2, wherein the second UBM layer is formed covering substantially the entire second back surface.

4. The method of claim 1 further comprising forming a first filler material into a first gap created by the first bumps between the first chip and the substrate.

5. The method of claim 1, wherein the step of bonding the second chip to the first chip comprises:
   aligning the plurality of second bumps with the plurality of third bumps; and
   performing a reflow process to transform the plurality of second bumps and the plurality of third bumps into a plurality of interface junction bumps.

6. The method of claim 5 comprising forming a second filler material into a second gap created by the interface junction bumps between the first chip and the second chip.

7. The method of claim 1 comprising forming a plurality of conductive wires connecting a bonding pad on the active surface of the second chip to one of the second contacts on the substrate surface.

8. The method of claim 7 comprising forming an encapsulate material to at least enclose the first chip, the second chip and the conductive wires.

9. A method for fabricating a multi-chip stack package, the method comprising:
   providing a substrate having a plurality of first contacts and a plurality of second contacts formed on a substrate surface;
   providing a first chip having a first active surface and a corresponding first back surface;
   providing a second chip having a second active surface and a corresponding second back surface;
   forming a first under-bump-metallurgy (UBM) layer over the first active surface of the first chip and a second under-bump-metallurgy layer covering substantially the entire first back surface of the first chip;
   forming a third under-bump-metallurgy layer covering substantially the entire second back surface of the second chip;
   forming a plurality of first bumps on the first UBM layer and a plurality of second bumps on second UBM layer;
   forming a plurality of third bumps on the third UBM layer;
   bonding the first chip to the substrate by bonding the first bumps to the first contacts;
   bonding the second chip to the first chip by bonding the second bumps to the third bumps;
   forming a filler material enclosing the first bumps, second bumps and the third bumps;
   forming a plurality of conductive wires connecting a bonding pad on the active surface of the second chip to one of the second contacts on the substrate surface; and
   forming an encapsulant to at least enclose the first chip, the second chip and the conductive wires.

* * * * *